(12) United States Patent
Kim et al.

(10) Patent No.: US 9,307,644 B2
(45) Date of Patent: Apr. 5, 2016

(54) CONNECTOR ASSEMBLY WITH AN ASYMMETRICALLY DISPOSED ALIGNMENT UNIT

(71) Applicant: Samsung Display Co., Ltd., Yongin, Gyeonggi-Do (KR)

(72) Inventors: KyungSik Kim, Asan-si (KR); Iksun Song, Asan-si (KR); DongKeon Kim, Busan (KR); Kwanghyun Baek, Asan-si (KR); Jiyoung Eom, Daejeon (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/510,209

(22) Filed: Oct. 9, 2014

(65) Prior Publication Data

US 2015/0200477 A1    Jul. 16, 2015

(30) Foreign Application Priority Data

Jan. 14, 2014 (KR) .......................... 10-2014-0004693

(51) Int. Cl.

| | |
|---|---|
| H01R 13/64 | (2006.01) |
| H05K 1/14 | (2006.01) |
| H01R 13/629 | (2006.01) |
| H01R 13/645 | (2006.01) |
| H01R 12/71 | (2011.01) |

(52) U.S. Cl.
CPC ............... *H05K 1/14* (2013.01); *H01R 12/712* (2013.01); *H01R 13/629* (2013.01); *H01R 13/6456* (2013.01); *H05K 1/144* (2013.01); *H05K 2201/1031* (2013.01); *H05K 2201/10136* (2013.01); *H05K 2201/10189* (2013.01); *H05K 2201/10265* (2013.01)

(58) Field of Classification Search
CPC ...... H01R 12/716; H01R 13/02; H01R 13/64; H01R 13/645; H01R 13/6456
USPC ................................ 439/64–65, 74, 677–678
See application file for complete search history.

(56) References Cited

U.S. PATENT DOCUMENTS

| | | | | |
|---|---|---|---|---|
| 6,007,352 A | * | 12/1999 | Azuma et al. | 439/108 |
| 6,619,965 B1 | * | 9/2003 | Kihira et al. | 439/74 |
| 6,626,690 B2 | * | 9/2003 | Homer et al. | 439/218 |
| 7,118,388 B2 | | 10/2006 | Midorikawa et al. | |
| 7,367,816 B2 | * | 5/2008 | Liu | 439/74 |
| 7,381,099 B1 | * | 6/2008 | Rohr et al. | 439/680 |

(Continued)

FOREIGN PATENT DOCUMENTS

| | | |
|---|---|---|
| JP | 2004-273277 A | 9/2004 |
| JP | 2005-122994 A | 5/2005 |

(Continued)

*Primary Examiner* — Chandrika Prasad
(74) *Attorney, Agent, or Firm* — Cantor Colburn LLP

(57) ABSTRACT

A connector assembly includes a socket connector which includes a socket housing, a plurality of first terminals spaced apart from each other in a first direction of the socket housing, and a first alignment unit which protrudes from the socket housing and is asymmetrically disposed with respect to a virtual line which passes through a center of the socket housing in a second direction perpendicular to the first direction, and a plug connector which is coupled to the socket connector and includes a plug housing, a plurality of second terminals spaced apart from each other in the first direction of the plug housing and respectively coupled to the plurality of first terminals, and a second alignment unit disposed on the plug housing and coupled to the first alignment unit.

20 Claims, 16 Drawing Sheets

(56) References Cited

U.S. PATENT DOCUMENTS

| | | | |
|---|---|---|---|
| 7,748,994 B1 * | 7/2010 | Peng et al. | 439/74 |
| 7,766,666 B1 * | 8/2010 | Chen et al. | 439/65 |
| 7,833,024 B2 * | 11/2010 | Takeuchi et al. | 439/74 |
| 8,137,114 B1 * | 3/2012 | Peng | 439/74 |
| 8,308,492 B2 | 11/2012 | Takeuchi et al. | |
| 8,425,250 B2 * | 4/2013 | Kagotani | 439/374 |
| 8,465,298 B2 | 6/2013 | Takeuchi et al. | |
| 2005/0112949 A1 | 5/2005 | Huang | |
| 2013/0137308 A1 | 5/2013 | Chiang et al. | |
| 2013/0210270 A1 | 8/2013 | Takeuchi et al. | |

FOREIGN PATENT DOCUMENTS

| | | |
|---|---|---|
| JP | 2007-227229 A | 9/2007 |
| JP | 2010-267572 A | 11/2010 |
| JP | 2011-003286 A | 1/2011 |
| JP | 2012-069263 A | 4/2012 |

* cited by examiner

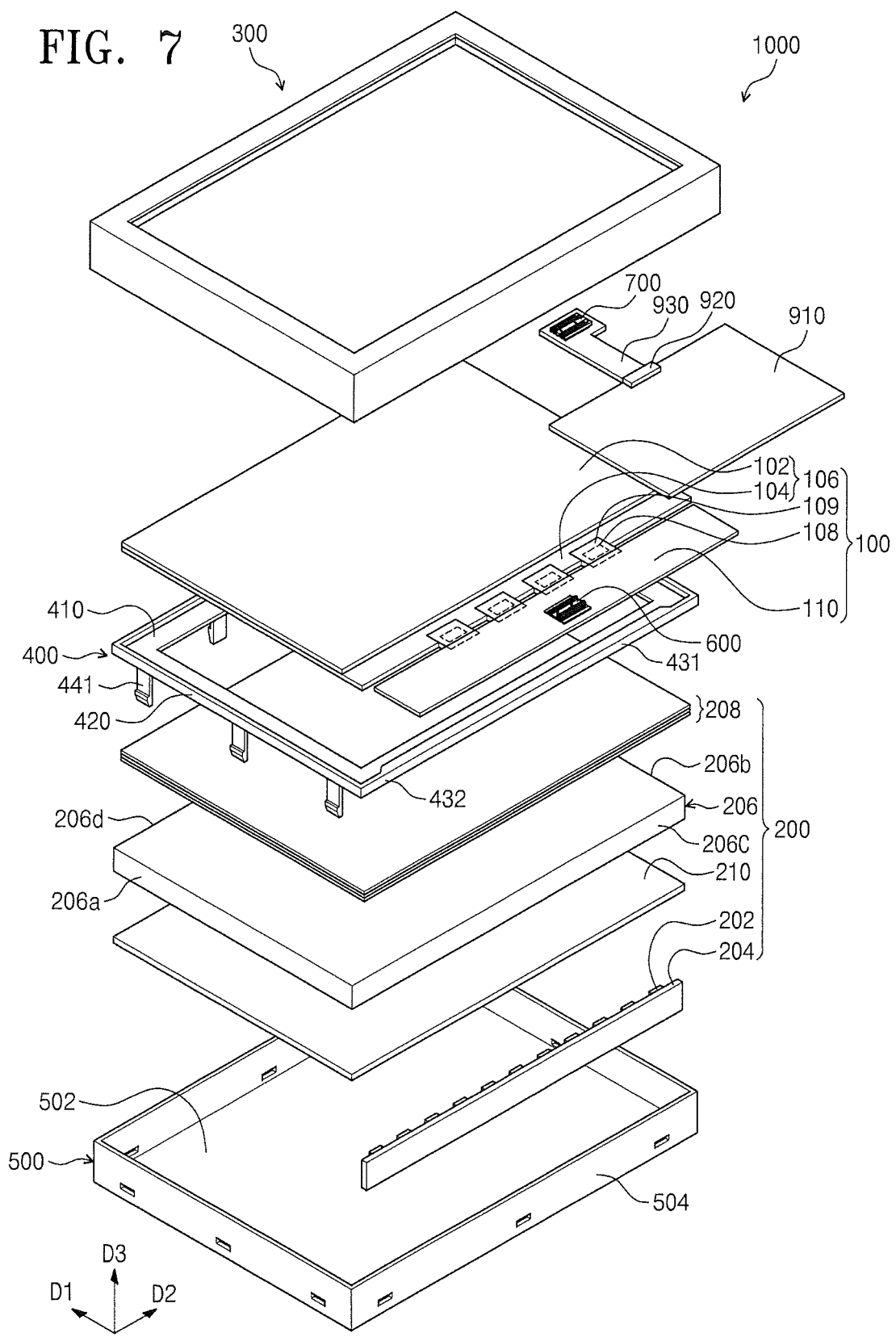

CONNECTOR ASSEMBLY WITH AN ASYMMETRICALLY DISPOSED ALIGNMENT UNIT

This application claims priority to Korean Patent Application No. 10-2014-0004693, filed on Jan. 14, 2014, and all the benefits accruing therefrom under 35 U.S.C. §119, the entire contents of which are hereby incorporated by reference.

BACKGROUND

1. Field

The invention herein relates to a connector assembly and a display apparatus having the same, and more particularly, to a connector assembly that is capable of effectively preventing misalignment from occurring and a display apparatus including the same.

2. Description of the Related Art

In general, connector assemblies are connection mechanisms for electrically connecting electric wires, circuits, and equipment. Such a connector assembly is constituted by a socket connector and plug connector, which are provided on a printed circuit board ("PCB") of an electronic communication device such as a computer, a television, a mobile phone, or the like. The socket connector and the plug connector may be connection units, which are connected to each other to input or output a required signal.

Each of the connectors of the connector assembly may include a housing disposed on a side of the PCB and a plurality of connection pins provided on the housing. The connection pins are aligned in one direction.

SUMMARY

When misalignment between a socket connector and a plug connector occurs in matching the socket connector and the plug each other, an electronic communication device may malfunction.

The invention provides a connector assembly that is capable of effectively preventing misalignment from occurring.

The invention also provides a display apparatus to which the connector assembly is adopted.

Exemplary embodiments of the invention provide connector assemblies including a socket connector, and a plug connector coupled to the socket connector. The socket connector includes a socket housing, a plurality of first terminals spaced apart from each other in a first direction of the socket housing, and a first alignment unit protruding from the socket housing, the first alignment unit asymmetrically disposed with respect to a virtual line that passes through a center of the socket housing in a second direction perpendicular to the first direction. The plug connector includes a plug housing, a plurality of second terminals spaced apart from each other in the first direction of the plug housing, the plurality of second terminals respectively coupled to the plurality of first terminals, and a second alignment unit disposed on the plug housing, the second alignment coupled to the first alignment unit.

In other exemplary embodiments of the invention, connector assemblies include a socket connector, and a plug connector coupled to the socket connector. The socket connector includes a base board, a socket housing disposed on the base board, a plurality of first terminals spaced apart from each other in a first direction of the socket housing, and a first alignment unit disposed on the base board, the first alignment unit being asymmetrically disposed with respect to a virtual line that passes through a center of the socket housing in a second direction perpendicular to the first direction.

The plug connector includes a plug housing, a plurality of second terminals spaced apart from each other in the first direction of the plug housing, the plurality of second terminals respectively coupled to the plurality of first terminals, and a second alignment unit disposed on the plug housing, the second alignment coupled to the first alignment unit.

In still other exemplary embodiments of the invention, display apparatuses include a display panel configured to display an image, and a printed circuit board ("PCB") electrically connected to the display panel and including a first connector, and a main circuit board supplying an electrical signal to the PCB, the main circuit board including a second connector coupled to the first connector.

The first connector includes a first housing, a plurality of first terminals spaced apart from each other in a first direction of the first housing, and a first alignment unit protruding from the first housing, the first alignment unit being asymmetrically disposed with respect to a virtual line that passes through a center of the first housing in a second direction perpendicular to the first direction.

The second housing includes a second housing, a plurality of second terminals spaced apart from each other in the first direction of the second housing, the plurality of second terminals respectively coupled to the plurality of first terminals, and a second alignment unit disposed on the second housing, the second alignment being coupled to the first alignment unit.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings:

FIG. 7 is an exploded perspective view of an exemplary embodiment of a display apparatus according to the invention;

DETAILED DESCRIPTION

Figure 1A:
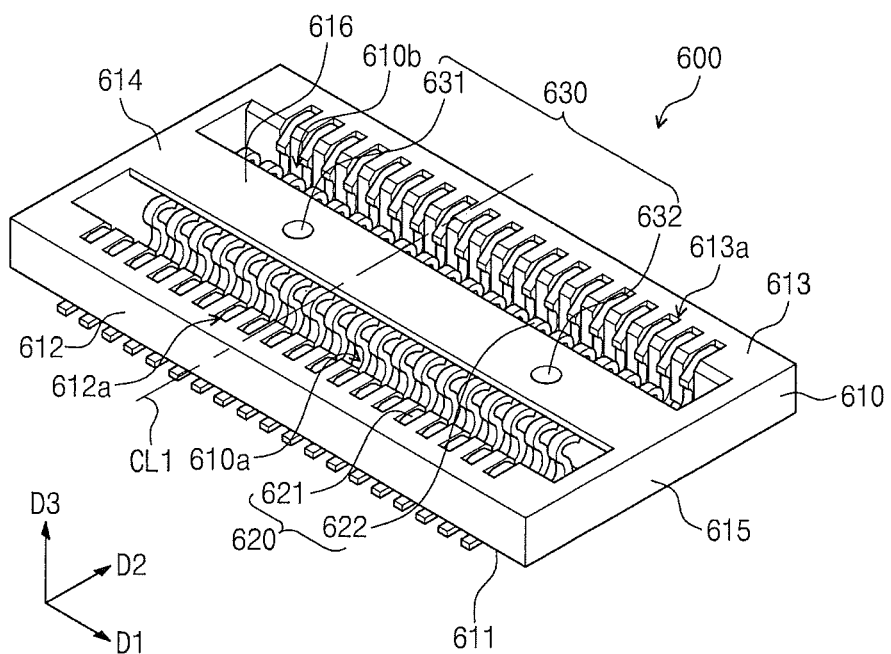
FIG. 1A is a perspective view of an exemplary embodiment of a socket connector according to the invention.

Since the invention may have diverse modified exemplary embodiments, preferred exemplary embodiments are illustrated in the drawings and are described in the detailed description of the invention. However, this does not limit the invention within specific exemplary embodiments and it should be understood that the invention covers all the modifications, equivalents, and replacements within the idea and technical scope of the invention.

Like reference numerals refer to like elements throughout. In the drawings, the dimensions and size of each structure are exaggerated, omitted, or schematically illustrated for convenience in description and clarity. It will be understood that although the terms "first, and "second" are used herein to describe various elements, these elements should not be limited by these terms. The terms are only used to distinguish one component from other components. Therefore, a component referred to as a first component in one embodiment can be referred to as a second component in another embodiment. The terms of a singular form may include plural forms unless referred to the contrary.

The meaning of 'include' or 'comprise' specifies a property, a figure, a step, an operation, an element, a component, or a combination thereof but does not exclude other properties, figures, steps, operations, elements, components, or combinations thereof. In the specification, it will be understood that when a layer (or film), a region, or a plate is referred to as being 'on' another layer, region, or plate, it can be directly on the other layer, region, or plate, or intervening layers, regions, or plates may also be present. On the contrary to this, it will be understood that when a layer (or film), a region, or a plate is referred to as being 'under' another layer, region, or plate, it can be directly under the other layer (or film), region, or plate, or intervening layers, regions, or plates may also be present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Exemplary embodiments of the invention will be described below in more detail with reference to the accompanying drawings.

A connector assembly according to the invention is constituted by a pair of connectors that match each other. Hereinafter, one of the pair of connectors is referred to as a socket connector, and the other one is referred to a plug connector. Since each of the socket connector and the plug connector is mounted on a surface of a circuit board or film, the connector assembly may be also referred to as a board-to-board connector.

In the illustrated exemplary embodiment, terms regarding directions such as an upward, downward, left, right, forward, and backward are used for explaining a structure and effect of each of parts of the connector assembly. When the terms represent directions of the connector assembly in the drawings, each of the terms may denote each direction. However, when the connector assembly is changed in direction, the direction may be changed corresponding thereto.

Figure 2A:
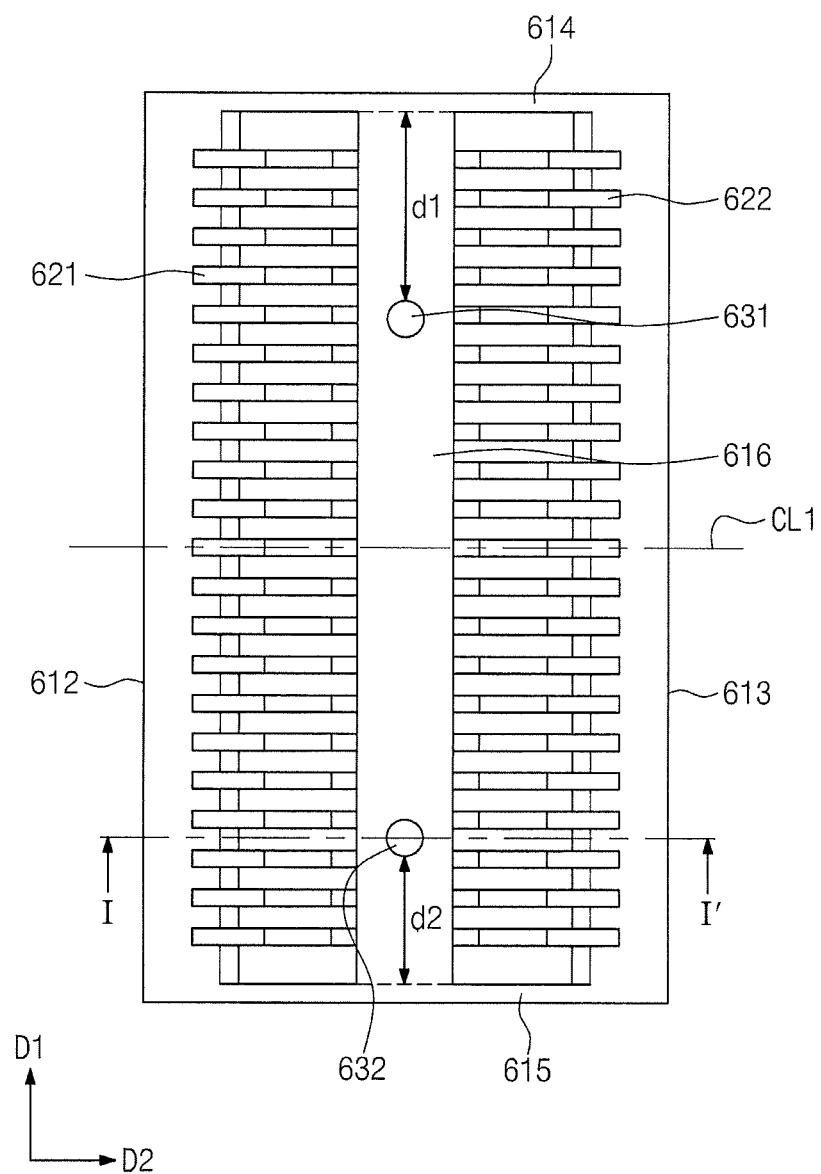
FIG. 2A is a plan view of the socket connector.
Figure 3A:
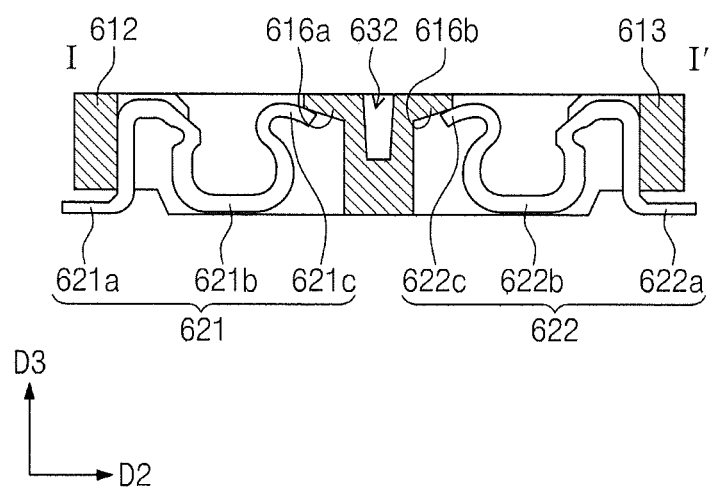
FIG. 3A is a cross-sectional view taken along line I-I' of FIG. 2A.

FIG. 1A is a perspective view of a socket connector according to an exemplary embodiment of the invention, FIG. 2A is a plan view of the socket connector, and FIG. 3A is a cross-sectional view taken along line I-I' of FIG. 2A.

Referring to FIGS. 1A, 2A, and 3A, a socket connector 600 includes a socket housing 610, a plurality of first terminals 620 spaced apart from each other in a first direction D1 on the socket housing 610, and a first alignment unit 630 provided on the socket housing 610.

In an exemplary embodiment, the socket housing 610 may include an insulating material such as a synthetic resin, for example. The socket housing 610 includes a socket bottom part 611, first and second sidewalls 612 and 613 vertically extending from the socket bottom part 611 and disposed parallel to each other in the first direction D1, and third and fourth sidewalls 614 and 615 vertically extending from the socket bottom part 611 and disposed parallel to each other in a second direction D2 that is perpendicular to the first direction D1.

First and second accommodation grooves 610a and 610b are defined in the socket housing 610 by the socket bottom part 611 and the first to fourth sidewalls 612 to 615. The first and second accommodation grooves 610a and 610b may be separately defined with a pillar 616 therebetween. Here, the pillar 616 is disposed between the first and second sidewalls 612 and 613. Particularly, the first accommodation groove 610a is lengthily defined in the first direction D1 between the first sidewall 612 and the pillar 616, and the second accommodation groove 610b is lengthily defined in the first direction D1 between the second sidewall 613 and the pillar 616.

A plurality of first slots 612a is defined in an inner surface of the first sidewall 612 that defines the first accommodation groove 610a, and a plurality of second slots 613a is defined in an inner surface of the second sidewall 613 that defines the second accommodation groove 610b. A first row 621 of the plurality of first terminals 620 is disposed in the plurality of first slots 612a and the first accommodation groove 610a, and a second row 622 of the plurality of first terminals 620 is disposed in the plurality of second slots 613a and the second accommodation groove 610b. That is, the plurality of first terminals 620 are disposed in two rows between the first sidewall 612 and the second sidewall 613. In an exemplary embodiment, the first row 621 and the second row 622 may have shapes that are symmetrical to each other with respect to the pillar 616.

The first alignment unit 630 is disposed between the first and second rows 621 and 622. The first alignment unit 630 may be asymmetrically disposed with respect to a first central line CL1 that passes through a center of the socket housing 610 in the second direction D2.

According to an exemplary embodiment of the invention, first and second alignment grooves 631 and 632 of the first alignment unit 630 are recessed by a predetermined depth from a top surface of the pillar 616. The first and second alignment grooves 631 and 632 are asymmetrically defined with respect to the first central line CL1. Particularly, the first alignment groove 631 is defined adjacent to the third sidewall 614 with respect to the first central line CL1, and the second alignment groove 632 is defined adjacent to the fourth sidewall 615 with respect to the first central line CL1.

When a distance between the first central line CL1 and the third sidewall 614 is the same as a distance between the first central line CL1 and the fourth sidewall 615, the first alignment groove 631 is spaced apart from the third sidewall 614 by a first distance d1, and the second alignment groove 632 is spaced apart from the fourth sidewall 615 by a second distance d2. According to an exemplary embodiment of the invention, the first and second distances d1 and d2 are different from each other.

Although the first and second distances d1 and d2 are different from each other in FIG. 2A, the invention is not limited thereto. According to another exemplary embodiment of the invention, the first and second alignment grooves 631 and 632 may have diameters different from each other in a plan view, or the number of first alignment groove 631 may be different from that of second alignment groove 632.

Referring to FIG. 3A, each of the plurality of terminals in the first row 621 includes a first leg 621a connected to a circuit board (not shown), a first contact 621b extending from the first leg 621a, fitted into the first slot 612a (see FIG. 1A), and electrically connected to the plug connector 700 (see FIG. 1B), and a first protrusion 621c protruding from the first contact 621b. The first leg 621a may protrude to the outside of the socket housing 610 and be electrically connected to the terminals of the circuit board. The first contact 621b has elasticity and be capable of being coupled to the plug connector 700. When a second terminal 720 (see FIG. 1B) of the plug connector 700 is inserted, the first contact 621b may be elastically deformed to accommodate the second terminal 720 of the plug connector 700. Then, the first contact 621b may grasp the second terminal 720 of the plug connector 700 by an elastic restoring force thereof to prevent the second terminal 720 from being separated. The first protrusion 621c protrudes from one end of the first contact 621b and be engaged with a first protruding hook 616a of the pillar 616 to prevent the second terminals of the plug connector 700 in the first row 621 from being separated in a third direction D3.

Each of the plurality of terminals in the second row 622 includes a second leg 622a connected to the circuit board (not shown), a second contact 622b extending from the second leg 622a, fitted into the second slot 613a (see FIG. 1A), and electrically connected to the plug connector 700 (see FIG. 1B), and a second protrusion 622c protruding from the second contact 622b. The second leg 622a may protrude to the outside of the socket housing 610 and be electrically connected to the terminals of the circuit board. The second contact 622b has elasticity and be capable of being coupled to the plug connector 700. When a second terminal 720 of the plug connector 700 is inserted, the second contact 622b may be elastically deformed to accommodate the second terminal. Then, the second contact 622b may grasp the second terminal 720 by an elastic restoring force thereof to prevent the second terminal 720 from being separated. The second protrusion 622c protrudes from one end of the second contact 622b and be engaged with a second protruding hook 616b of the pillar 616 to prevent the terminals in the second row 622 from being separated in the third direction D3.

In the exemplary embodiment, the terminals in the first row 621 and the terminals in the second row 622 may be disposed symmetrical to each other with respect to the pillar 616. Although the configuration of each of the first terminals 620 is exemplified in FIG. 3A, the invention is not limited to the configurations of the first terminals 620.

Figure 1B:
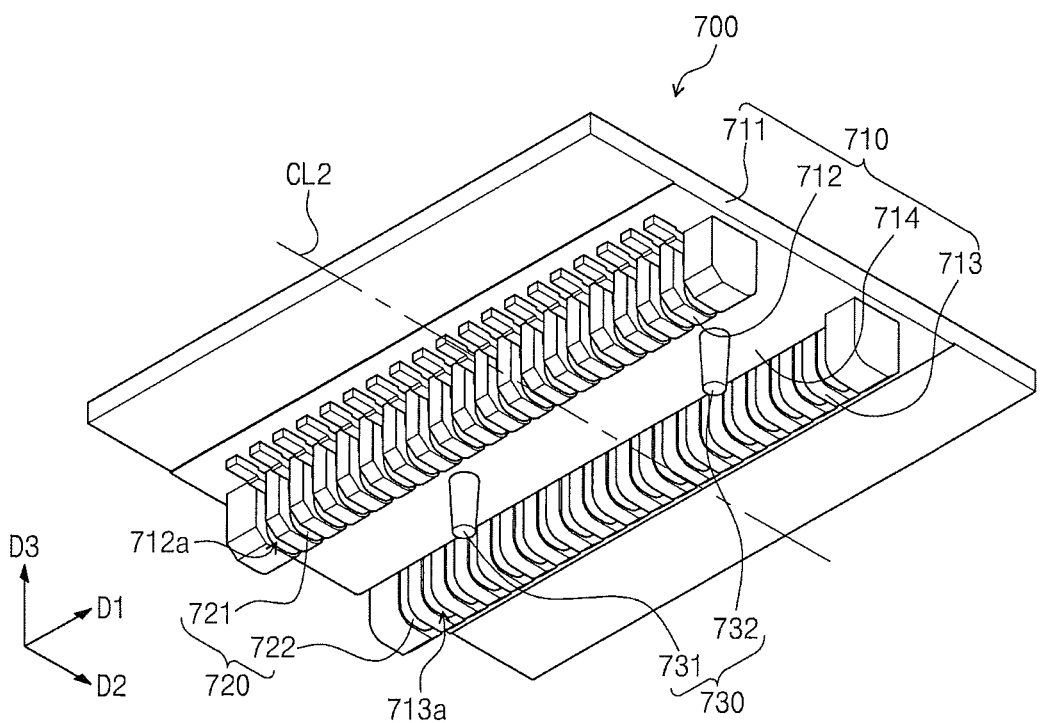
FIG. 1B is a perspective view of an exemplary embodiment of a plug connector according to the invention.
Figure 2B:
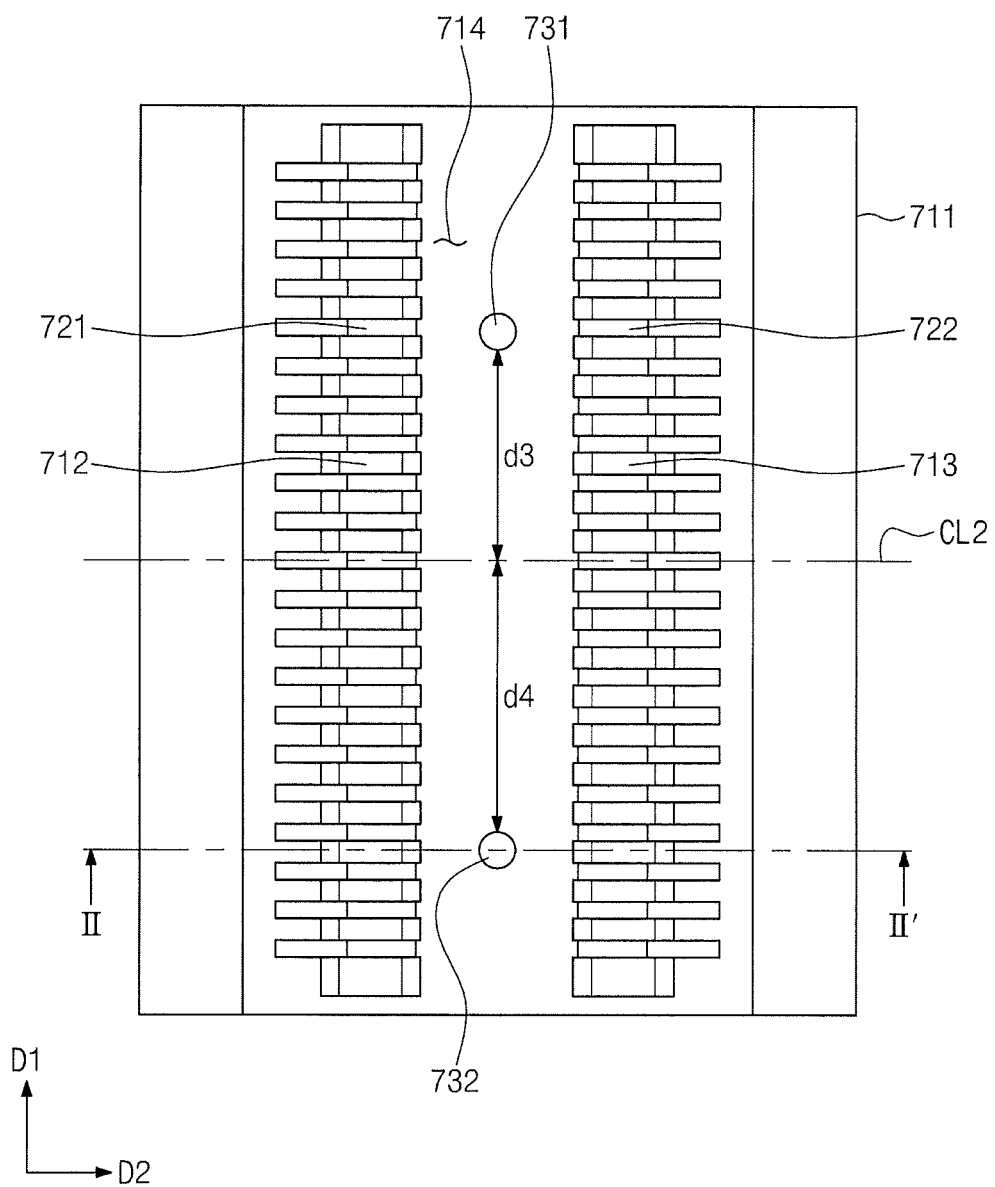
FIG. 2B is a plan view of the plug connector.
Figure 3B:
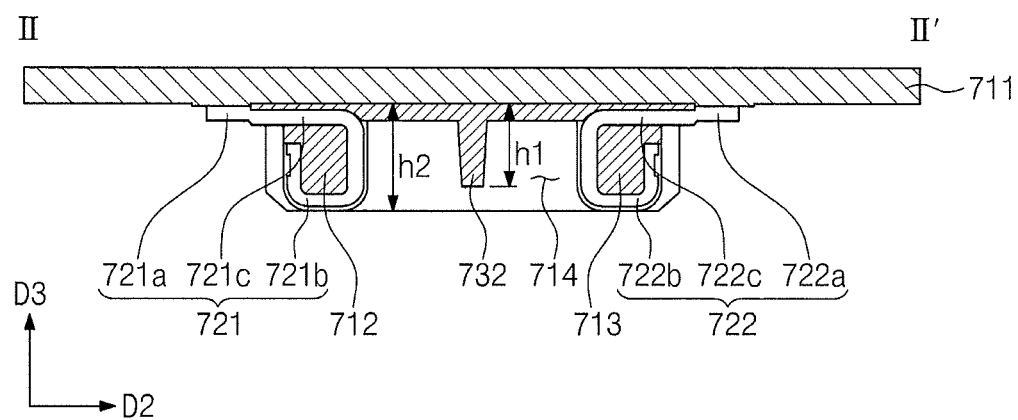
FIG. 3B is a sectional view taken along line II-II' of FIG. 2B.

FIG. 1B is a perspective view of the plug connector according to an exemplary embodiment of the invention, FIG. 2B is a plan view of the plug connector, and FIG. 3B is a cross-sectional view taken along line II-II' of FIG. 2B.

Referring to FIGS. 1B, 2B, and 3B, the plug connector 700 includes a plug housing 710, a plurality of second terminals 720 spaced apart from each other in a first direction D1 on the plug housing 710 and coupled in a one-to-one correspondence to the first terminals 620, and a second alignment unit 730 provided on the plug housing 710 and coupled to the first alignment unit 630.

The plug housing 710 includes a plug bottom part 711 and fifth and sixth sidewalls 712 and 713 that protrude from the plug bottom part 711 and are disposed parallel to each other in the first direction D1. A plurality of grooves 712*a* is defined in the fifth sidewall 712, and a plurality of second grooves 713*a* is defined in the sixth sidewall 713.

A first row 721 of the plurality of second terminals 720 is disposed in the plurality of first grooves 712*a*, and a second row 722 of the plurality of second terminals 720 is disposed in the plurality of second grooves 713*a*. A third accommodation groove 714 for accommodating the pillar 616 of the socket connector 600 is defined between the fifth and sixth sidewalls 712 and 713. That is, the plurality of second terminals 720 may be disposed in two rows along the fifth and sixth sidewalls 712 and 713, and the first and second rows 721 and 722 may have shapes that are symmetrical to each other with respect to the third accommodation groove 714.

The second alignment unit 730 may be asymmetrically disposed with respect to a second central line CL2 that passes through a center of the plug housing 710 in the second direction D2. According to an exemplary embodiment of the invention, the second alignment unit 730 includes first and second alignment protrusions 731 and 732, which are disposed to one-to-one correspond to the first and second alignment grooves 631 and 632 of the socket connector 600 and respectively coupled to the first alignment grooves 631 and 632. The first and second alignment protrusions 731 and 732 may protrude from the plug bottom part 711 and be disposed in the second accommodation groove 714 between the fifth and sixth sidewalls 712 and 713.

The first and second alignment protrusions 731 and 732 may be asymmetrically disposed with respect to the second central line CL2. Particularly, the first alignment protrusion 731 is spaced apart from the second central line CL2 by a third distance d3, and the second alignment protrusion 732 is spaced apart from the second central line CL2 by a fourth distance d4. In the illustrated exemplary embodiment, the third and fourth distances d3 and d4 are different from each other.

Although the third and fourth distances d3 and d4 are different from each other in FIG. 2B, the invention is not limited thereto. According to another exemplary embodiment of the invention, the first and second alignment protrusions 731 and 732 may have diameters different from each other in a plan view, or the number of first alignment protrusion 731 may be different from that of second alignment protrusion 732.

As shown in FIG. 3B, each of the plurality of second terminals 720 in the first row 721 includes a third leg 721*a* connected to the circuit board (not shown), a third contact 721*b* extending from the third leg 721*a*, fitted into the first groove 712*a*, and electrically connected to the socket connector 630, and a first connection part 721*c* connecting the third contact 721*b* to the third leg 721*a*. The third leg 721*a* may protrude to the outside of the plug housing 710 and be electrically connected to the terminals of the circuit board. The third contact 721*b* may surround the fifth sidewall 712 along the first groove 712*a*. The first connection part 721*c* may connect the third contact 721*b* to the second leg 721*a* and be buried in a lower end of the fifth sidewall 721.

The third contact 721*b* has a surface that contacts the first contact 621*b* of the socket connector 600 to electrically connect the socket connector 600 to the plug connector 700.

Each of the plurality of second terminals 720 in the second row 722 includes a fourth leg 722*a* connected to the circuit board (not shown), a fourth contact 722*b* extending from the fourth leg 722*a*, fitted into the second groove 713*a*, and electrically connected to the socket connector 630, and a second connection part 722*c* connecting the fourth contact 722*b* to the fourth leg 722*a*. The fourth leg 722*a* may protrude to the outside of the plug housing 710 and be electrically connected to the terminals of the circuit board. The fourth contact 722*b* may surround the fifth sidewall 712 along the second groove 713*a*. The second connection part 722*c* may connect the fourth contact 722*b* to the fourth leg 722*a* and be buried in a lower end of the sixth sidewall 713.

The fourth contact 722*b* has a surface that contacts the second contact 622*b* of the socket connector 600 to electrically connect the socket connector 600 to the plug connector 700.

Also, a height h1 from the plug bottom part 711 to a top surface of the second alignment protrusion 732 may be equal to or less than a height h2 from the plug bottom part 711 to a top surface of each of the second terminals 720.

Figure 4:
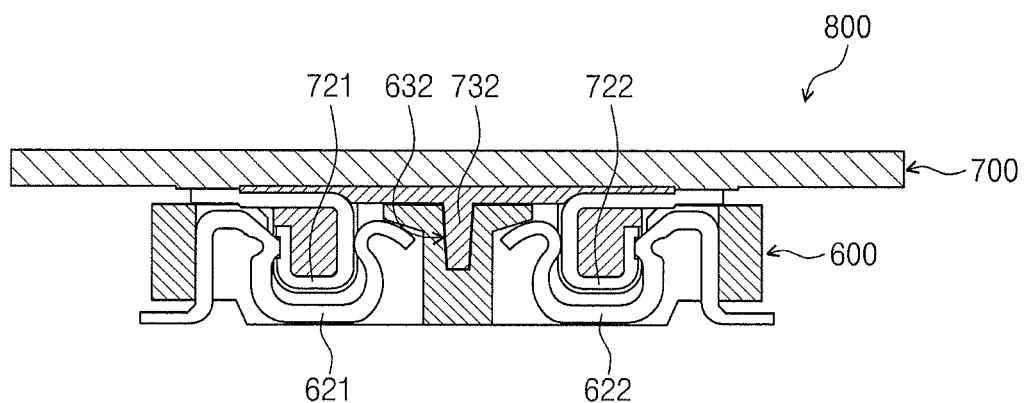
FIG. 4 is a cross-sectional view illustrating a coupled state of a connector assembly.
Figure 5:
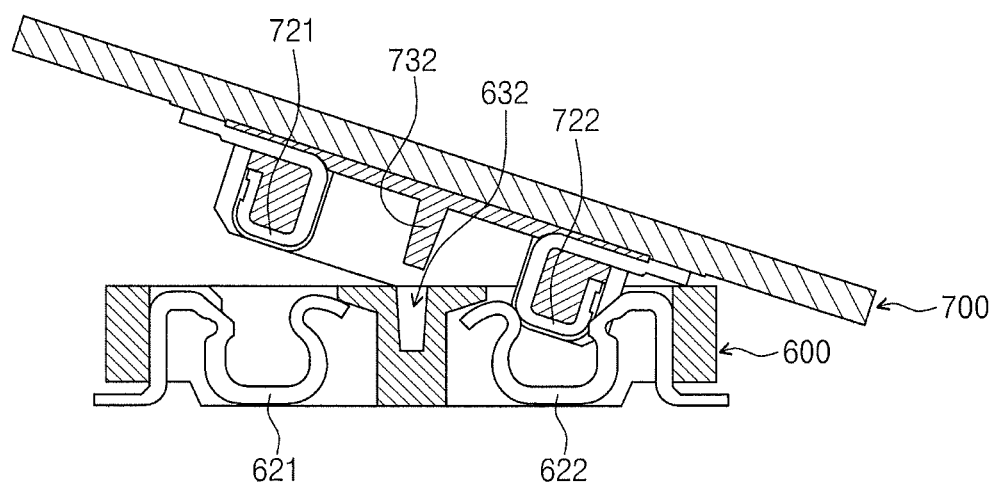
FIG. 5 is a cross-sectional view illustrating a process of separating the connector assembly.

FIG. 4 is a cross-sectional view illustrating a coupled state of a connector assembly, and FIG. 5 is a cross-sectional view illustrating a process of separating the connector assembly.

Referring to FIG. 4, before the socket connector 600 and the plug connector 700 are coupled each other, surfaces of the socket and plug connectors 600 and 700 may be matched to face each other. In this state, when the first socket connector 600 and the plug connector 700 match each other, the first and second rows 721 and 722 of the second terminals 720 of the plug connector 700 may be inserted to contact the first and second rows 621 and 622 of the second terminals of the socket connector 600, respectively. As a result, a connector assembly 800 is completed.

Since the first and second alignment unit 630 (see FIG. 1A) and 730 (see FIG. 1B) are coupled to each other before the socket connector 600 and the plug connector 700 are coupled to each other, misalignment between the first terminal 620 and the second terminal 720 may be prevented. Particularly, the first and second alignment units 630 and 730 may prevent the first and second terminals 620 and 720 from being misaligned in the first direction D1.

Also, since the first and second alignment units 630 and 730 are asymmetrically disposed with respect to the first and second central lines CL1 and CL2, respectively, the plug connector 700 and the socket connector 600 are prevented from being coupled to each other when one of the plug connector 700 and the socket connector 600 rotates at an angle of 180 degrees (°). Thus, it may prevent the first terminals of the socket connector 600 in the first and second rows 621 and 622 from being respectively coupled to the second terminals 720 of the plug connector 700 in the second and first rows 722 and 721.

Referring to FIG. 5, when disassembling the connector assembly 800, i.e., separating the plug connector 700 and the socket connector 600, the plug connector 700 may be inclined in one direction. When the above-described processes are repeatedly performed, a relatively large force may be applied to the terminals that are disposed in one row, and thus, the terminals may be pushed and deformed.

However, when the first and second alignment units 630 and 730 are respectively provided to the socket connector 600 and the plug connector 700, the first and second alignment grooves 631 and 632 may be coupled to the first and second alignment protrusions 731 and 732 to prevent the plug connector 700 from being inclined in one direction. Thus, it may prevent the terminals from being deformed while the socket connector 600 and the plug connector 700 are separated from each other.

Figure 6A:
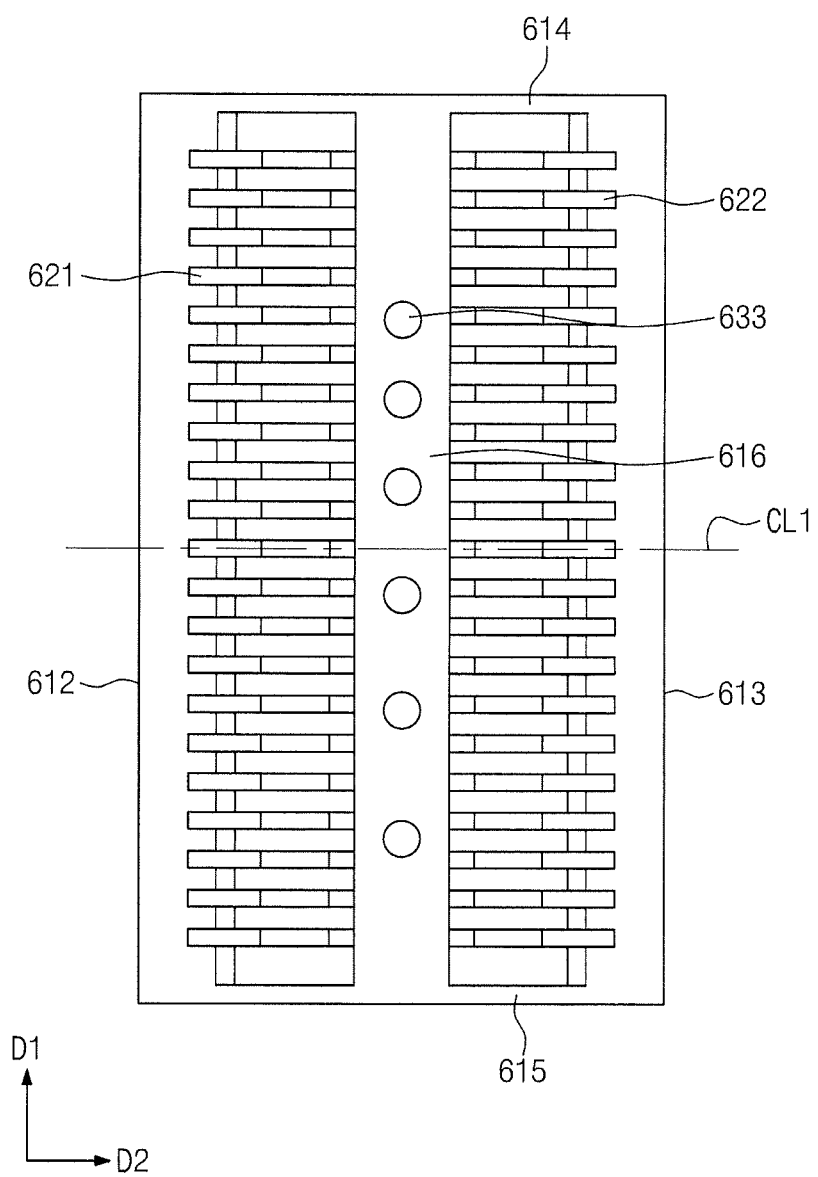
FIG. 6A is a plan view of another exemplary embodiment of a socket connector according to the invention.
Figure 6B:
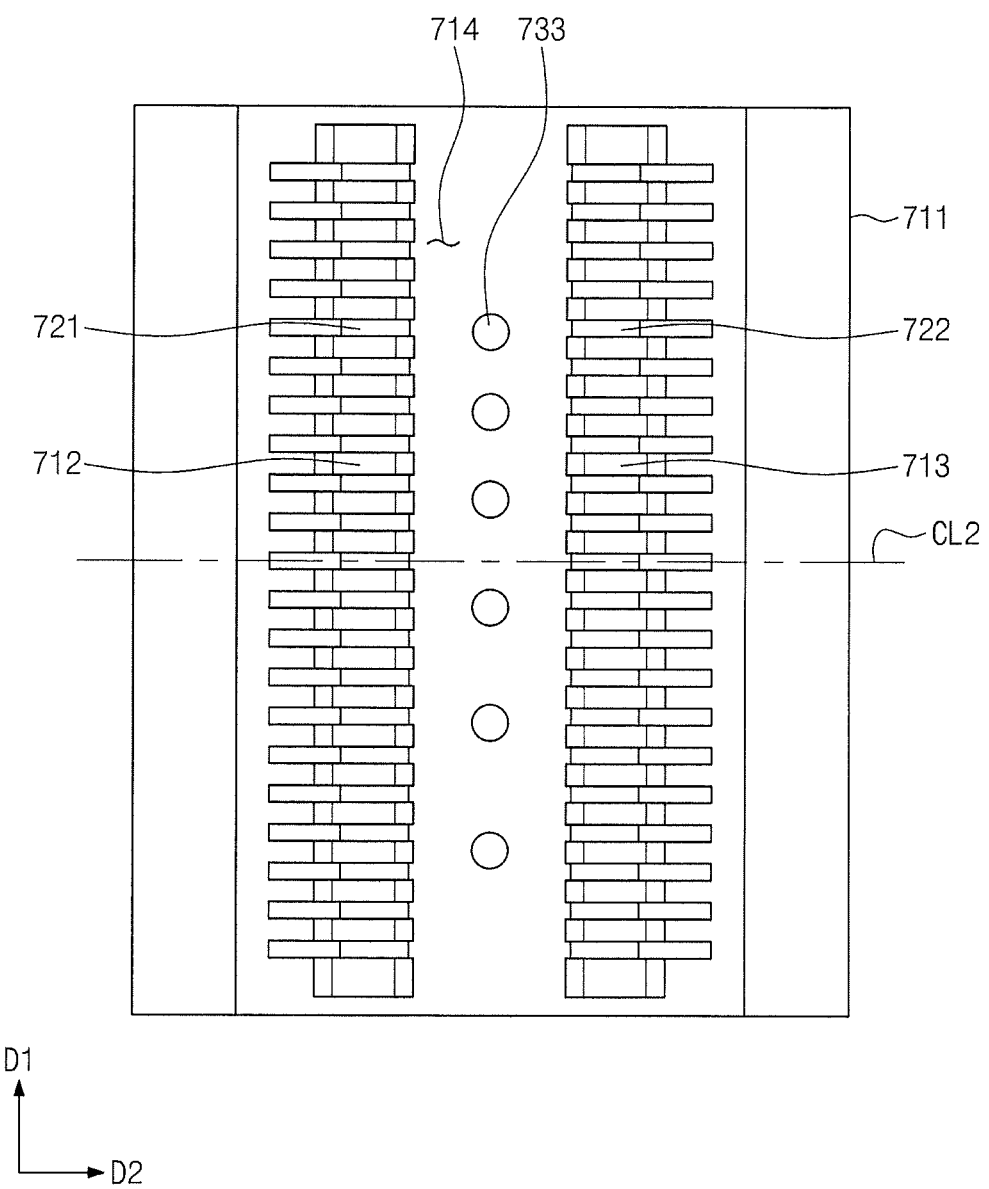
FIG. 6B is a plan view of another exemplary embodiment of a plug connector according to the invention.

FIG. 6A is a plan view of a socket connector according to another exemplary embodiment of the invention, and FIG. 6B is a plan view of a plug connector according to another exemplary embodiment of the invention. In FIGS. 6A and 6B, the same components as those of FIGS. 2A and 2B will be designated by the same reference numeral, and their detailed descriptions will be omitted.

Referring to FIGS. 6A and 6B, a plurality of alignment grooves 633 of a first alignment unit 630 of a socket connector 600 is arranged in a first direction D1 according to another exemplary embodiment of the invention. The alignment grooves 633 may be arranged at irregular intervals in the first direction D1.

In an exemplary embodiment, the distance between the alignment grooves 633 may gradually increase from the third sidewall 614 toward the fourth sidewall 615, for example.

The second alignment unit 730 of the plug connector 700 includes a plurality of alignment protrusions 733 that are disposed to correspond to the plurality of alignment grooves 633.

Since the alignment grooves 633 and the alignment protrusions 733 are coupled to each other before the socket connector 600 and the plug connector 700 match each other, misalignment between a first terminal 620 and a second terminal 720 may be prevented. Particularly, the alignment grooves 633 and the align protrusions 733 may prevent the first and second terminals 620 and 720 from being misaligned in the first direction D1.

Also, each of the distances between the alignment grooves 633 and between the alignment protrusions 733 gradually increases or decreases in one direction, the plug connector 700 may rotate at an angle of about 180° to prevent the plug connector 700 from being coupled to the socket connector 600. Thus, it may prevent the first terminals 620 of the socket connector 600 in the first and second rows 621 and 622 from being respectively coupled to the second terminals 720 of the plug connector 700 in the second and first rows 722 and 721.

Figure 8:
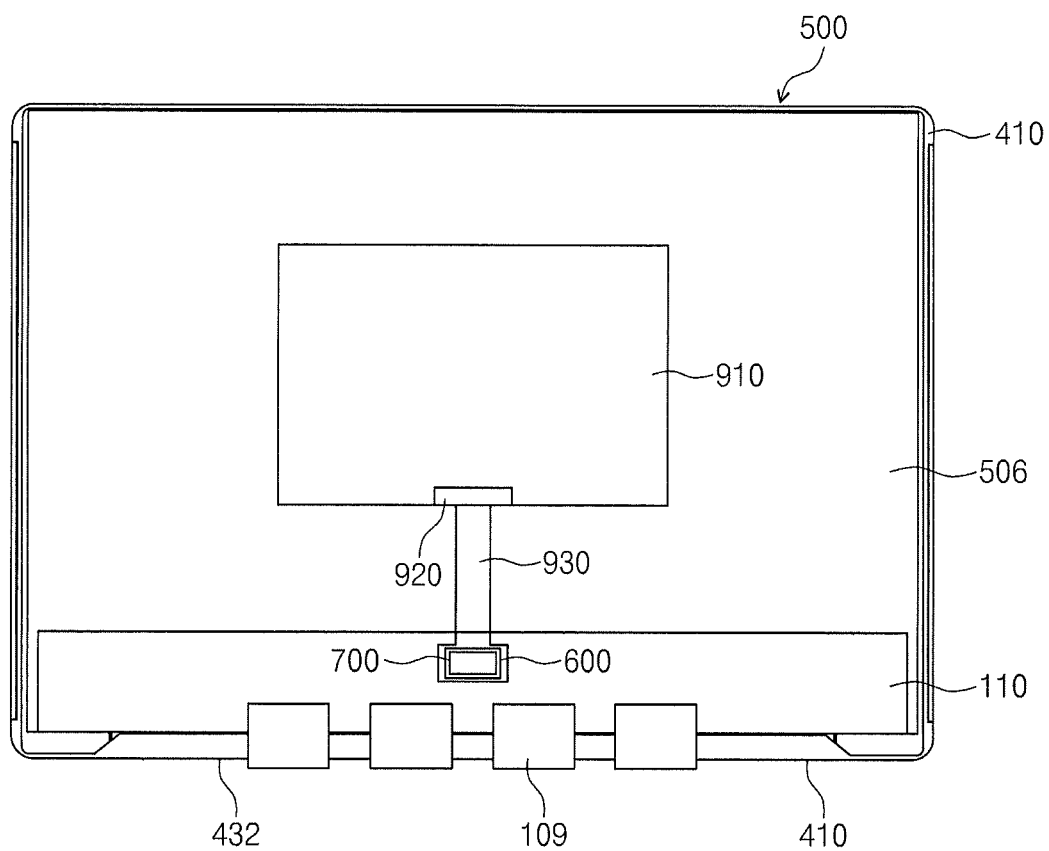
FIG. 8 is a bottom view of the display apparatus.

FIG. 7 is an exploded perspective view of a display apparatus according to an exemplary embodiment of the invention, and FIG. 8 is a bottom view of the display apparatus.

Referring to FIGS. 7 and 8, a display apparatus 1000 includes a display unit 100, a backlight unit 200, a top chassis 300, a mold frame 400, and a bottom chassis 500.

In view of plane, the display apparatus 1000 may have a rectangular structure. A short axis direction of the display apparatus 1000 may be defined as a first direction D1, and a long axis direction of the display apparatus 100 may be defined as a second direction D2 that is perpendicular to the first direction D1. Also, the bottom chassis 500, the backlight unit 200, the mold frame 400, the display unit 100, and the top chassis 300 of the display apparatus 1000 may be successively stacked in a third direction D3 that is perpendicular to the first and second directions D1 and D2.

The display unit 100 includes a display panel 106 for displaying an image, a driving chip 108 for providing a driving signal to the display panel 106, and a printed circuit board ("PCB") 110 electrically connected to the display panel 106.

The display panel 106 includes a first substrate 102, a second substrate 104 coupled to face the first substrate 102, and a liquid crystal layer (not shown) disposed between the first substrate 102 and the second substrate 104. Although the display panel includes a liquid display panel in FIG. 7, the invention is not limited to the display panel 106 including the liquid crystal panel.

A plurality of pixels is disposed on the first substrate 102 in a matrix form. Each of the plurality of pixels includes a gate line (not shown) extending in the first direction D1, a data line (not shown) extending in the second direction D2 and insulated from the gate line to cross the gate line, and a pixel electrode (not shown). Also, a thin film transistor (not shown) is disposed on each of the pixels and connected to the gate line, the data line, and the pixel electrode.

In an exemplary embodiment, red, green and blue pixels (not shown), for example, that are color pixels and a common electrode (not shown) facing the pixel electrode are disposed on the second substrate 104. In an exemplary embodiment, the color pixel and the common electrode may be disposed on the first substrate 102. The liquid crystal layer may be arranged according to intensity of electric fields that are generated between the pixel electrode and the common electrode to adjust transmissivity of light emitted from the backlight unit 200, thereby displaying a grayscale image.

The driving chip 108 for applying a data signal to the data line may be disposed on at least one side of the first substrate 102. The driving chip 108 may generate the data signal to be applied to the data line of the display panel 106 in response to an external signal. The external signal may be a signal that is supplied from the PCB 110. The external signal may include an image signal, various control signals, a driving voltage, and the like.

A gate driving circuit for applying a gate signal to the gate line may be disposed on the other side of the first substrate 102 through a thin film process. Thus, the gate driving circuit may be built in the display panel 106.

According to another exemplary embodiment of the invention, the driving chip 108 may include at least two chips that are divided into a data driving chip and a gate driving chip. The driving chip 108 may be mounted on the first substrate 102 by a chip on glass process.

The PCB 110 may be electrically connected to the display panel 106 by a plurality of tape carrier packages ("TCPs") 106. The driving chip 106 may be mounted on the TCPs 109. The TCPs 109 may be bent to surround a side surface of the bottom chassis 500.

The PCB 110 connected to the TCPs 109 may be disposed under the bottom chassis 500. In this case, the display apparatus 1000 may further include a shield case (not shown) that is disposed under the bottom chassis to protect the PCB 110.

The PCB 110 may receive various signals required for operating the display apparatus 1000 from a main PCB 910. A flexible circuit film 930 is coupled to a side of the main PCB 910 through a connector 920. A plug connector 700 is attached to an end of the flexible circuit film 930. A socket connector 600 to be coupled to the plug connector 700 is attached to the PCB 110. The plug connector 700 may match the socket connector 600 to electrically connect the PCB 110 to the main PCB 910. As a result, the various signals may be transmitted from the main PCB 910 to the PCB 110.

The backlight unit 200 may include a light source 202 for emitting light and a light guide plate 206 that receives light from the light source 202 to guide the light toward the display unit 100.

According to an exemplary embodiment of the invention, the backlight unit 200 may be an edge type backlight unit. That is, the light source 202 of the backlight unit 200 may provide the light toward at least one side surface of the light guide plate 206 from a lower side of the display panel 106, and the light guide plate 206 may guide the light toward the display unit 100.

The light guide plate 206 includes a first side surface 206a lengthily extending in the first direction D1 of the display apparatus 1000, a second side surface 206b that is parallel to the first side surface 206a, a third side surface 206c lengthily extending in the second direction D2 of the display apparatus 1000, and a fourth side surface 206d that is parallel to the third side surface 206c. According to an exemplary embodiment of the invention, the light source 202 may be disposed adjacent to the third side surface 206c of the light guide plate 206.

The backlight unit 200 may further include a light source support 204 for supporting the light source 202. The light source support 204 may be disposed to face the third side surface 206c and have a plate shape. In an exemplary embodiment, the light source 202 may include a plurality of light emitting diodes ("LEDs"). The plurality of LEDs may be spaced apart from each other in the second direction D2 on the light source support 204.

The backlight unit 200 may further include a plurality of optical sheets 208 disposed between the light guide plate 206 and the display unit 100 and a reflecting plate 210 disposed under the light guide plate 206.

The plurality of optical sheets 208 includes a diffusion sheet for diffusing light and at least one sheet of light collection sheet for collecting light. Thus, the plurality of optical sheets 208 may improve brightness and a viewing angle of light emitted from an emission surface. The reflecting plate 210 may reflect light that leaks from a reflecting surface to allow the light to be re-incident into the light guide plate 206.

The bottom chassis 500 may include a bottom part 502 on which the backlight unit 200 is seated and a sidewall 504 that extends from the bottom part 502 in a vertical direction (e.g., the third direction D3).

The mold frame 400 may be disposed between the display unit 100 and the backlight unit 200 to support the display panel 106. The mold frame 400 includes a support 410 for supporting the display panel 106, a first sidewall 420 extending from the support 410 in the third direction D3, a second sidewall 432 crossing the first sidewall 420 and supporting members 441 protruding from bottom surface of the support 410.

The top chassis 300 is coupled to face the bottom chassis 500. Also, the top chassis 300 covers an edge of the display panel 106. According to an exemplary embodiment of the invention, each of the top chassis 300 and the bottom chassis 500 may include a metal material.

The bottom chassis 500 includes the bottom part 502 on which the backlight unit 200 is seated and the sidewall 504 extending from the bottom part 502. A plurality of openings may be defined in the sidewall 504, and the supporting members 441 of the support 410 may be respectively connected to the plurality of openings of the sidewall 504. The light source 202, the light source support 204, the reflecting plate 210, the light guide plate 206, and the optical sheets 208 of the backlight unit 200 may be successively accommodated on the bottom part 502.

When the components of the backlight unit 200 are successively accommodated into the bottom chassis 500, the mold frame 400 may be seated on the components. The display panel 106 is seated on the support 410 of the mold frame 400.

Referring to FIG. 8, the TCP 109 may be bent along a sidewall of the bottom chassis 500, and the PCB 110 may be seated on a back surface 506 of the bottom chassis 500. The main PCB 910 is seated on the back surface 506, and the PCB 110 and the main PCB 910 may be electrically connected to each other on the back surface 506 by coupling the socket connector 600 to the plug connector 700.

Figure 9:
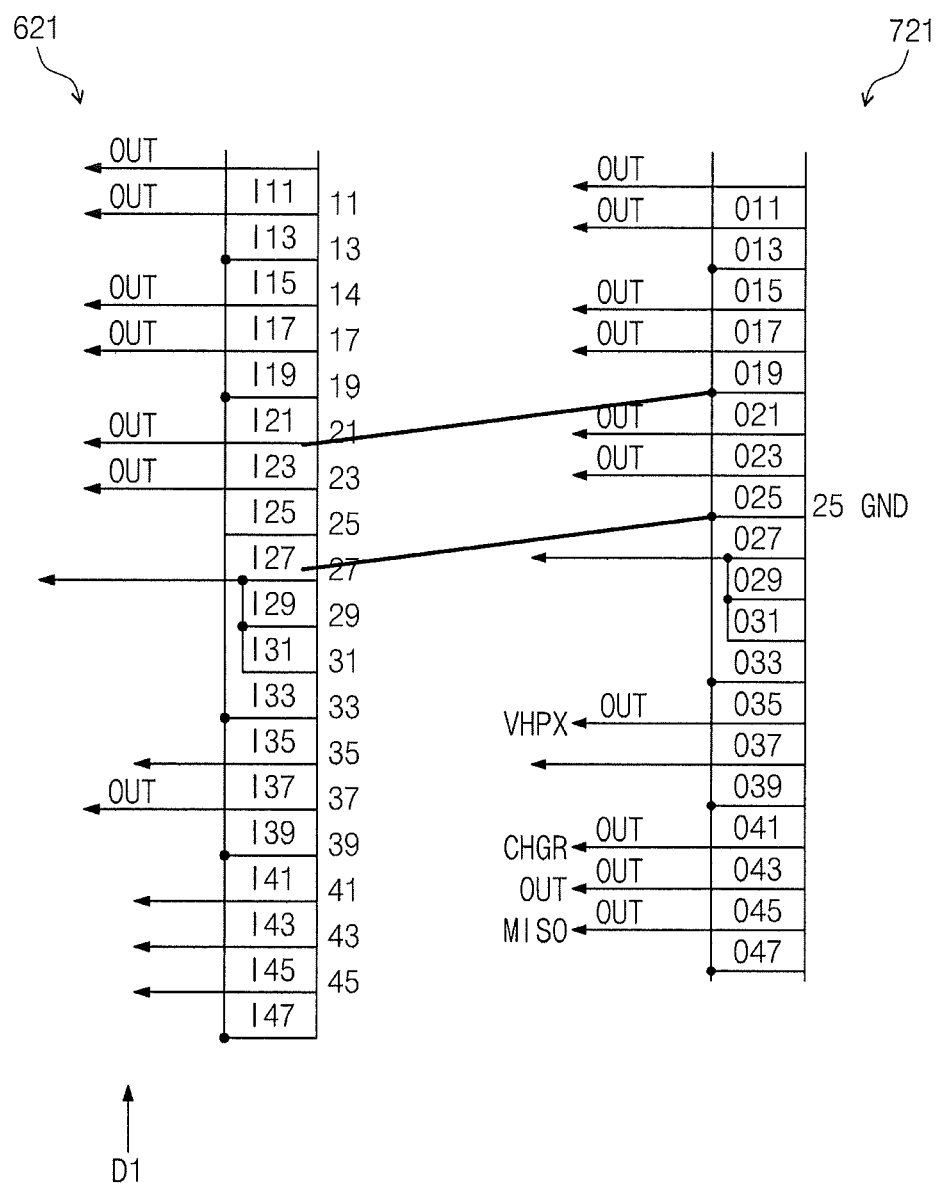
FIG. 9 is a view of a matching relationship between a second terminal of the plug connector and a first terminal of the socket connector.

FIG. 9 is a view of a matching relationship between a second terminal 720 of the plug connector and a first terminal of the socket connector.

Referring to FIG. 9, a first row 721 of the second terminal 720 of the plug connector 700 (refers to FIG. 1B) and a first row 621 of a first terminal 620 of the socket connector 600 (refers to FIG. 1A) are illustrated. In FIG. 9, the first row 721 of the second terminal 720 includes a No. 11 output terminal O11 to a No. 47 output terminal O47. The first row 621 of the first terminal 720 may also include a No. 11 input terminal I11 to a No. 47 input terminal I47.

The No. 11 output terminal O11 to the No. 47 output terminal O47 may one-to-one correspond to the No. 11 input terminal I11 to the No. 47 input terminal I47 to output a signal to the corresponding terminal or receive a signal from the corresponding terminal.

However, when the output and input terminals that correspond to each other are misaligned in the first direction D1, a No. 21 input terminal I21 may be connected to a No. 19 output terminal O19, or a No. 27 input terminal I27 may be connected to a No. 25 output terminal O25, for example.

The No. 27 input terminal I27 may be a terminal for receiving a light source driving voltage VLED for operating the light source 202 of the backlight unit 200 (refer to FIG. 7) when correctly aligned. However, when the misalignment in the first direction D1 occurs, a No. 25 output terminal O25 may be connected to the No. 27 input terminal I27, for example. As a result, a ground voltage GND may be applied to the No. 27 input terminal I27. In this case, the light source 202 of the backlight unit 200 may not normally operate.

Also, a No. 21 input terminal I21 may be a terminal for receiving an image signal MIPI_3N, for example, when correctly aligned. However, when the misalignment in the first direction D1 occurs, the No. 19 output terminal O19 may be connected to the No. 21 input terminal I21, for example. As a result, the ground voltage GND may be applied to the No. 21 input terminal I21. In this case, a normal image may not be displayed on the display panel 100.

As described above, when the misalignment occurs in the connector assembly 800 (refer to FIG. 4), the display apparatus 1000 may not normally operate.

However, when the first and second alignment units 630 and 730 are provided on the socket connector 600 and the plug connector 700, it may prevent the socket connector 600 and the plug connector 700 from being misaligned in the first direction D1.

Figure 10A:
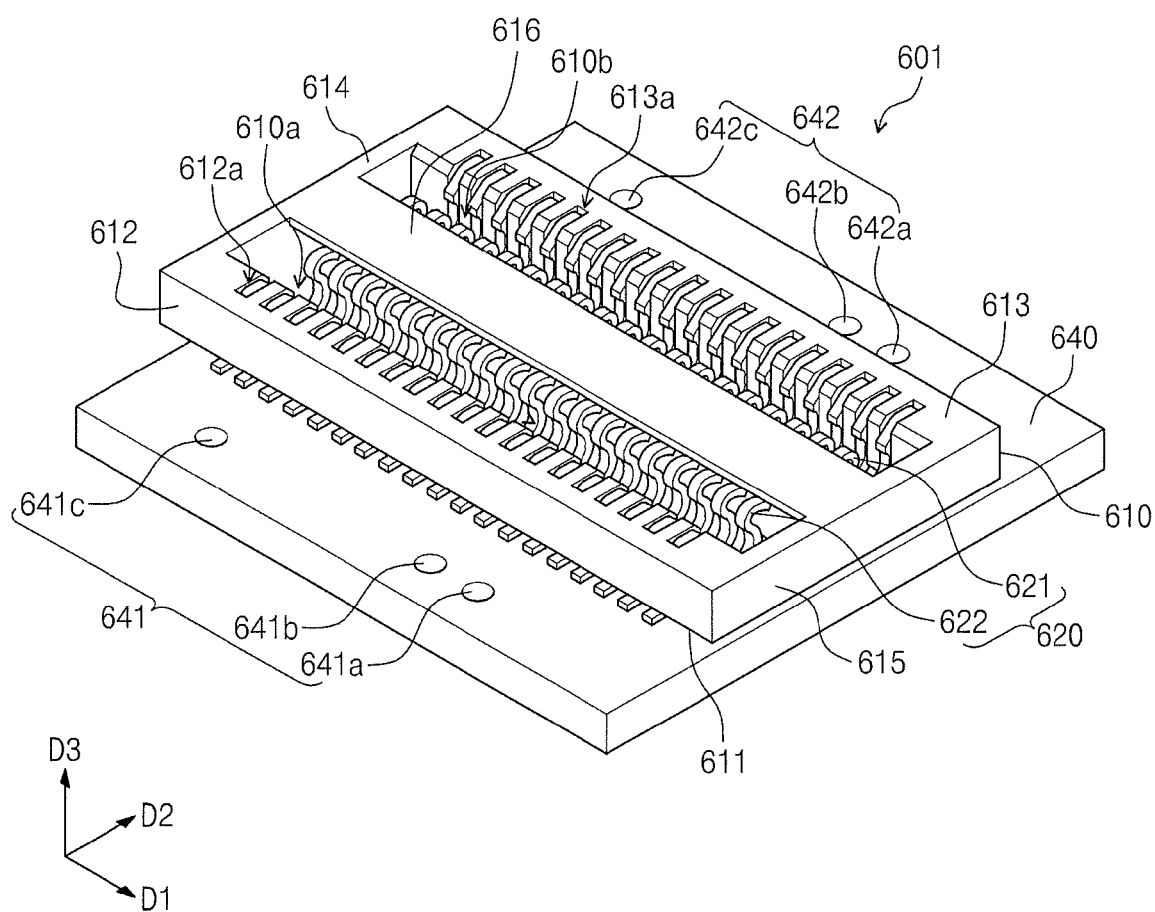
FIG. 10A is a perspective view of an exemplary embodiment of a socket connector according to the invention.
Figure 11A:
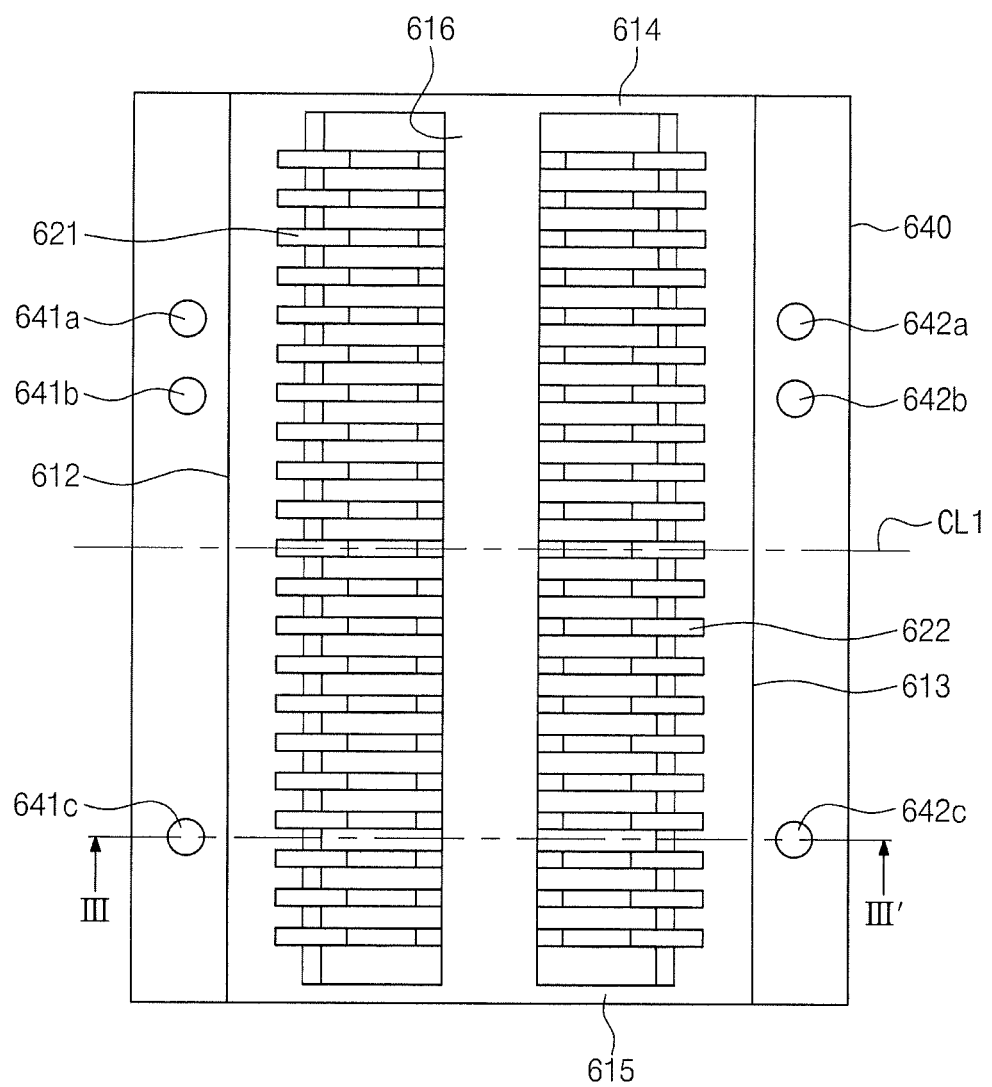
FIG. 11A is a plan view of the socket connector shown in FIG. 10A.
Figure 12A:
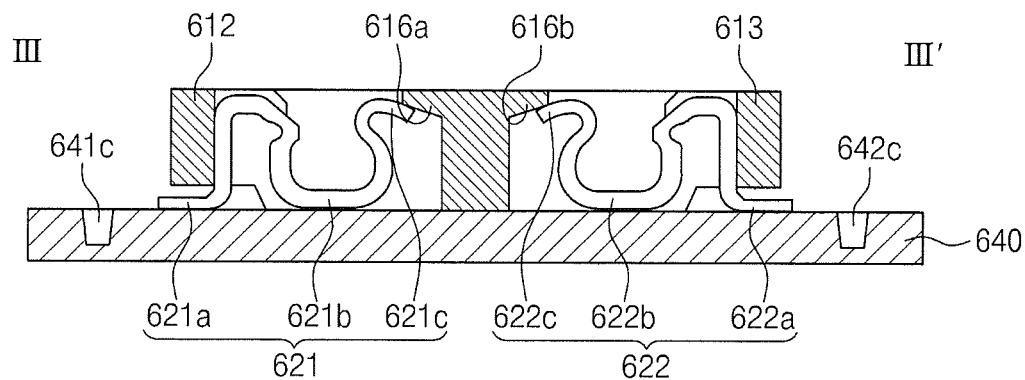
FIG. 12A is a cross-sectional view taken along line III-III' of FIG. 11A.

FIG. 10A is a perspective view of a socket connector according to an exemplary embodiment of the invention, FIG. 11A is a plan view of the socket connector, and FIG. 12A is a cross-sectional view taken along line III-III' of FIG. 11A. In FIGS. 10A, 11A and 12A, the same components as those of FIGS. 1A, 2A, and 3A will be designated by the same reference numeral, and their detailed descriptions will be omitted.

Referring to FIGS. 10A, 11A, and 12A, a socket connector 601 includes a base board 640, a socket housing 610 disposed on the base board 640, a plurality of first terminals disposed spaced apart from each other in a first direction D1 on the socket housing 610, and third and fourth alignment units 641 and 642 disposed on the base board 640.

In an exemplary embodiment, the base board 640 may have a square plate shape. The third alignment unit 641 is disposed adjacent to a first sidewall 612 of the socket housing 610, and the fourth alignment unit 642 is disposed adjacent to a second sidewall 613 of the socket housing 610.

Third, fourth, and fifth alignment grooves 641a, 641b, and 641c of the third alignment unit 641 are recessed from a top surface of the base board 640. The third and fourth alignment grooves 641a and 641b may be disposed in a side of the fourth sidewall 615 with respect to a first central line CL1 that passes through a center of the socket housing 610 in a second direction D2, and the fifth alignment groove 641c may be defined in a side of the third sidewall 614 with respect to the first central line CL1.

Sixth, seventh, and eighth grooves 642a, 642b, and 642c of the fourth alignment unit 642 are recessed from the top surface of the base board 640. The sixth and seventh alignment grooves 642a and 642b may be disposed in a side of the fourth sidewall 615 with respect to the first central line CL1, and the eighth alignment groove 642c may be defined in a side of the third sidewall 614 with respect to the first central line CL1.

That is, the numbers of alignment grooves may be different from each other at both sides of the first central line CL1.

Although the numbers of alignment grooves which are defined in both sides of the first central line CL1 are different from each other in FIGS. 10A and 11A, the invention is not limited thereto. According to another exemplary embodiment of the invention, the alignment grooves 641a to 641c and 642a to 642c may have diameters different from each other in a plan view.

Figure 10B:
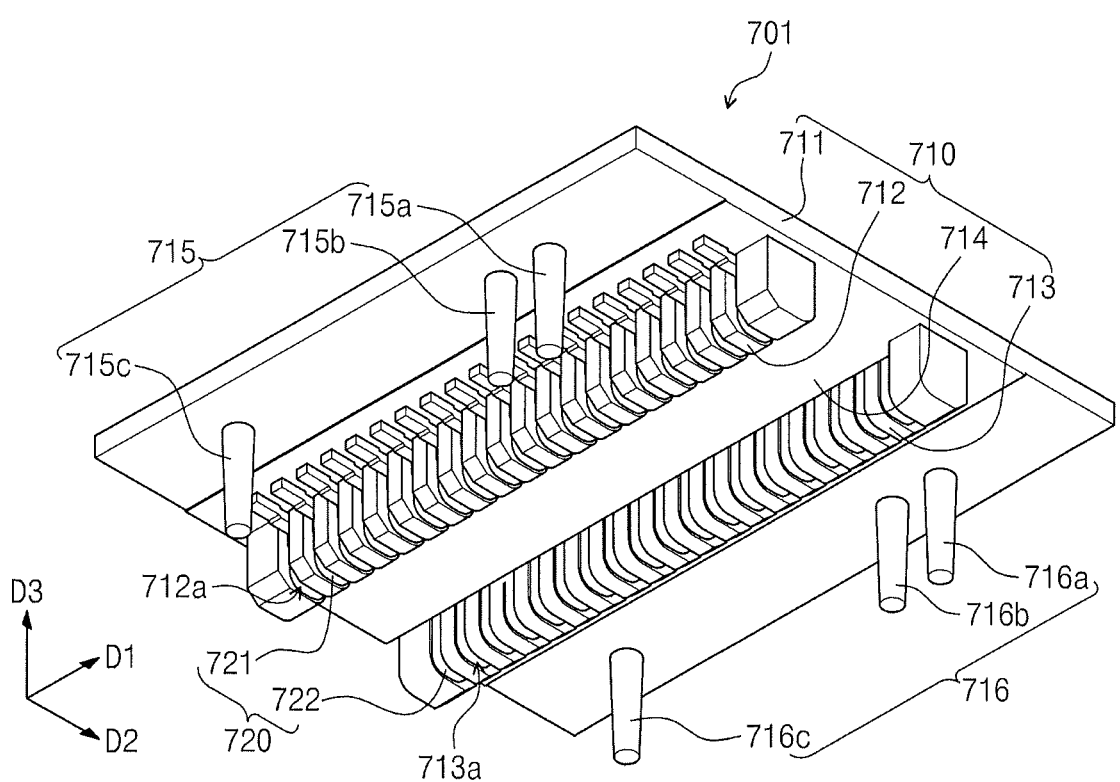
FIG. 10B is a perspective view of an exemplary embodiment of a plug connector according to the invention.
Figure 11B:
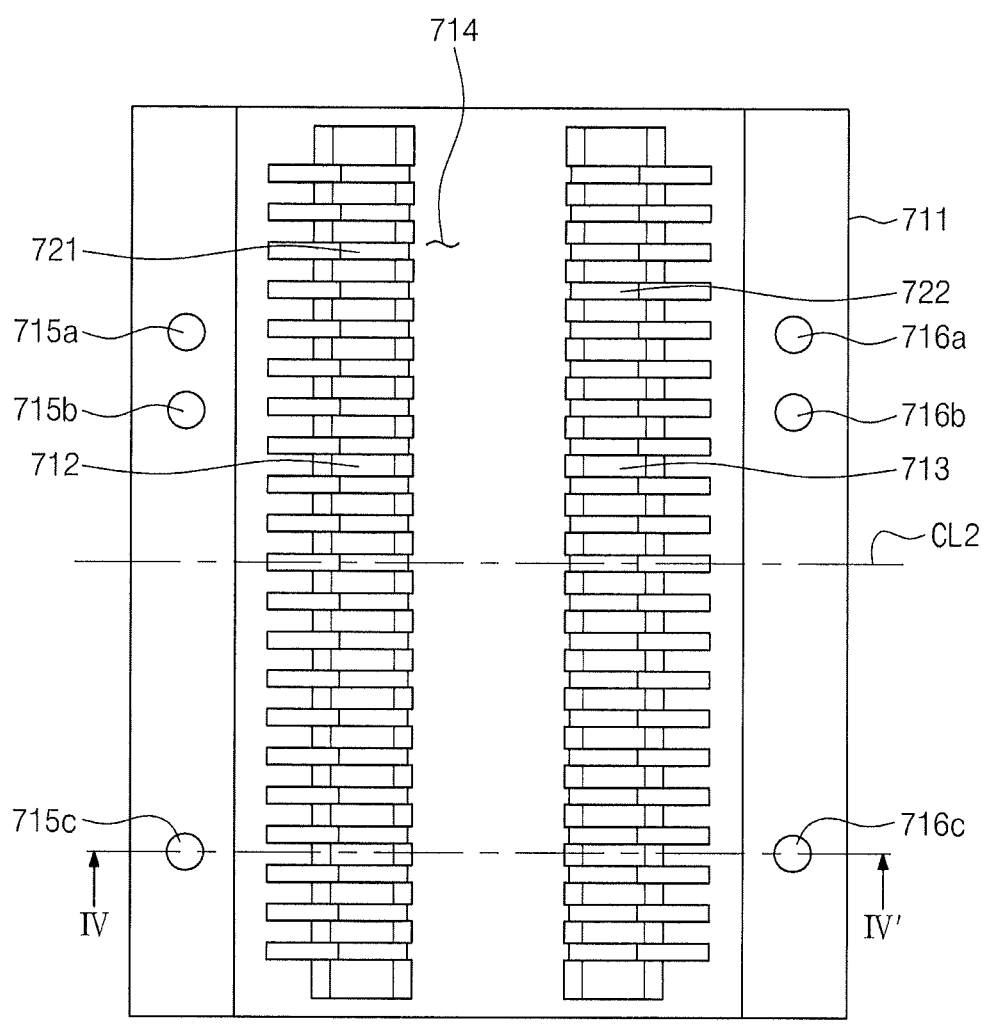
FIG. 11B is a plan view of the plug connector shown in FIG. 10B.
Figure 12B:
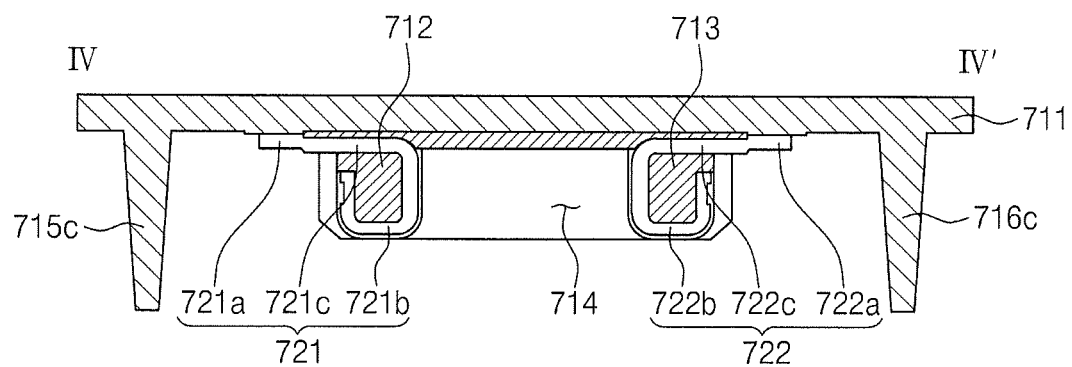
FIG. 12B is a cross-sectional view taken along line IV-IV' of FIG. 11B.

FIG. 10B is a perspective view of a plug connector according to an exemplary embodiment of the invention, FIG. 11B is a plan view of the plug connector, and FIG. 12B is a cross-sectional view taken along line IV-IV' of FIG. 11B. In FIGS. 10B, 11B and 12B, the same components as those of FIGS. 1B, 2B, and 3B will be designated by the same reference numeral, and their detailed descriptions will be omitted.

Referring to FIGS. 10B, 11B, and 12B, a plug connector 701 includes a plug housing 710, a plurality of second terminals 720 spaced apart from each other in the first direction D1 on the plug housing 710 and coupled in a one-to-one correspondence to the first terminals 620, and fifth and sixth alignment units 715 and 716 disposed on the plug housing 710 and respectively coupled to the third and fourth alignment units 641 and 642.

The plug housing 710 includes a plug bottom part 711 and fifth and sixth sidewalls 712 and 713 that protrude from the plug bottom part 711 and are disposed parallel to each other in the first direction D1.

The fifth alignment unit 715 includes third, fourth, and fifth alignment protrusions 715a, 715b, and 715c which protrude from the plug bottom part 711. The sixth alignment unit 716 includes sixth, seventh, and eighth alignment protrusions 716a, 716b, and 716c which protrude from the plug bottom part 711.

The third and fourth alignment protrusions 715a and 715b may be disposed in one side of the plug bottom part 711 with respect to a second central line CL2 that passes through a center of the plug housing 710 to extend in the second direction D2, and the fifth alignment protrusion 715c may be defined in the other side of the plug bottom part 711 with respect to the second central line CL2.

The sixth and seventh alignment protrusions 716a and 716b may be disposed in one side of the plug bottom part 711 with respect to the second central line CL2, and the eighth alignment protrusion 716c may be defined in the other side of the plug bottom part 711 with respect to the second central line CL2.

That is, the numbers of alignment protrusions may be different from each other at both sides of the second central line CL2.

Although the numbers of alignment protrusions which are defined in both sides of the second central line CL2 are different from each other in FIGS. 10B and 11B, the invention is not limited thereto. According to another exemplary embodiment of the invention, the alignment protrusions 715a to 641c and 716a to 716c may have diameters different from each other.

Figure 13:
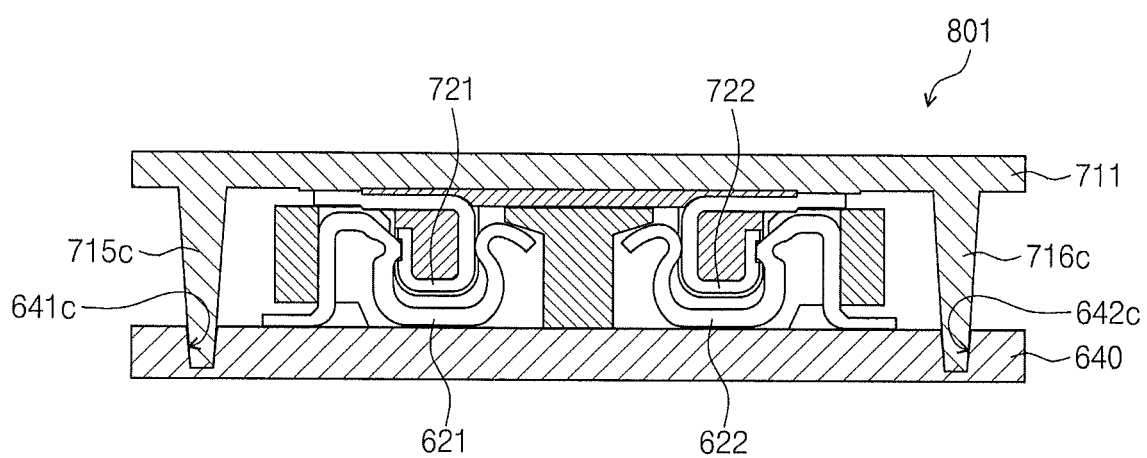
FIG. 13 is a cross-sectional view illustrating a coupled state of a connector assembly.

FIG. 13 is a cross-sectional view illustrating a coupled state of a connector assembly.

Referring to FIG. 13, before the socket connector 601 matches the plug connector 701, matching surfaces of the socket and plug connectors 601 and 701 may face each other. In this state, when the first socket connector 601 and the plug connector 701 match each other, the second terminals 720 of the plug connector 701 in first and second rows 721 and 722 may be inserted to contact the second terminals of the socket connector 600 in the first and second rows 621 and 622, respectively. As a result, a connector assembly 801 is completed.

Since the third and fourth alignment units 641 and 642 are coupled to the fifth and sixth alignment units 715 and 716 before the socket connector 601 and the plug connector 701 match each other, misalignment between the first terminal 620 and the second terminal 720 may be prevented. Particularly, the third to sixth alignment units 641, 642, 715, and 716 may prevent the first and second terminals 620 and 720 from being misaligned in the first direction D1.

Also, since each of the third and fourth alignment units 641 and 642 is asymmetrically disposed with respect to the first central line CL1, and each of the fifth and sixth alignment units 715 and 716 is asymmetrically disposed with respect to the second central line CL2, the plug connector 710 may rotate at an angle of about 180° to prevent the plug connector 701 from being coupled to the socket connector 601. Thus, it may prevent the first terminals 620 of the socket connector 601 in the first and second rows 621 and 622 from being respectively coupled to the second terminals 720 of the plug connector 701 in the second and first rows 722 and 721.

As described above, since the first and second alignment units are coupled to each other before the socket connector and the plug connector match each other, the misalignment between the first terminal and the second terminal may be prevented.

Since each of the first and second alignment units is asymmetrically disposed with respect to the central line, the plug connector may rotate an angle of about 180° to prevent the plug connector from being coupled to the socket connector. Thus, it may prevent the first terminals of the socket connector in the first and second rows from being respectively coupled to the second terminals of the plug connector in the second and first rows.

It will be apparent to those skilled in the art that various modifications and variations can be made in the invention. Thus, it is intended that the invention covers the modifications and variations of this invention provided they come within the scope of the appended claims and their equivalents.

What is claimed is:

1. A connector assembly comprising:
   a socket connector comprising:
      a socket housing;
      a plurality of first terminals spaced apart from each other in a first direction of the socket housing; and
      a first alignment unit which protrudes from the socket housing and is asymmetrically disposed with respect to a virtual line which passes through a center of the socket housing in a second direction perpendicular to the first direction; and
   a plug connector which is coupled to the socket connector and comprises:
      a plug housing;
         a plurality of second terminals spaced apart from each other in the first direction of the plug housing and respectively coupled to the plurality of first terminals; and
         a second alignment unit disposed on the plug housing and coupled to the first alignment unit.

2. The connector assembly of claim 1, wherein
the plurality of first terminals is arranged in the second direction perpendicular to the first direction, and
the first alignment unit is disposed between two rows of the plurality of first terminals.

3. The connector assembly of claim 1, wherein the socket housing comprises:
a socket bottom part;
first and second sidewalls vertically extending from the socket bottom part and disposed parallel to the first direction; and
third and fourth sidewalls vertically extending from the socket bottom part and disposed parallel to the second direction.

4. The connector assembly of claim 3, wherein
a plurality of alignment grooves is defined in the first alignment unit and arranged along the first direction and comprises:
a first alignment groove adjacent to the third sidewall; and
a second alignment groove adjacent to the fourth sidewall, and
a first distance between the third sidewall and the first alignment groove is different from a second distance between the fourth sidewall and the second alignment groove.

5. The connector assembly of claim 4, wherein the second alignment unit comprises a plurality of alignment protrusions which respectively corresponds to the plurality of alignment grooves defined in the first alignment unit and is respectively coupled to the plurality of alignment grooves.

6. The connector assembly of claim 5, wherein the plug housing comprises:
a plug bottom part; and
fifth and sixth sidewalls protruding from the plug bottom part and disposed parallel to the first direction,
wherein the plurality of alignment protrusions protrudes from the plug bottom part and is disposed between the fifth and sixth sidewalls.

7. The connector assembly of claim 6, wherein
a plurality of grooves coupled to the plurality of second terminals is defined in the fifth and sixth sidewalls, and
a height from the plug bottom part to a top surface of each of the alignment protrusions is less than a height from the plug bottom part to a top surface of each of the plurality of second terminals.

8. The connector assembly of claim 3, wherein a plurality of slots coupled to the plurality of first terminals is defined in the first and second sidewalls.

9. The connector assembly of claim 3, wherein
a plurality of alignment grooves is defined in the first alignment unit and arranged at irregular intervals in the first direction,
the second alignment unit comprises a plurality of alignment protrusions which are arranged at irregular intervals in the first direction.

10. The connector assembly of claim 9, wherein a distance between adjacent alignment grooves of the plurality of alignment grooves gradually increases from the third sidewall to the fourth sidewall.

11. A connector assembly comprising:
a socket connector which comprises:
a base board;
a socket housing disposed on the base board;
a plurality of first terminals spaced apart from each other in a first direction of the socket housing; and
a first alignment unit disposed on the base board and asymmetrically disposed with respect to a virtual line which passes through a center of the socket housing in a second direction perpendicular to the first direction, and
a plug connector which is coupled to the socket connector and comprises:
a plug housing;
a plurality of second terminals spaced apart from each other in the first direction of the plug housing and respectively coupled to the first terminals; and
a second alignment unit disposed on the plug housing and coupled to the first alignment unit.

12. The connector assembly of claim 11, wherein
a plurality of alignment grooves is defined in the first alignment unit and arranged in the first direction, asymmetrically disposed with respect to the virtual line, and recessed from a top surface of the base board, and
the second alignment unit comprises a plurality of alignment protrusions which is respectively inserted into and coupled to the plurality of alignment grooves.

13. The connector assembly of claim 12, wherein the number of alignment grooves of the plurality of alignment grooves on one side of the first alignment unit with respect to the virtual line is different from that of alignment grooves of the plurality of alignment grooves on the other side of the first alignment unit with respect to the virtual line.

14. The connector assembly of claim 12, wherein the plug housing comprises:
a plug bottom part; and
fifth and sixth sidewalls protruding from the plug bottom part and disposed parallel to the first direction,
wherein the plurality of alignment protrusions protrudes from the plug bottom part and is disposed outside at least one of the fifth and sixth sidewalls.

15. A display apparatus comprising:
a display panel configured to display an image; and
a printed circuit board electrically connected to the display panel and comprising a first connector which comprises:
a first housing;
a plurality of first terminals spaced apart from each other in a first direction of the first housing; and
a first alignment unit which protrudes from the first housing, is asymmetrically disposed with respect to a virtual line which passes through a center of the first housing in a second direction perpendicular to the first direction; and
a main circuit board which supplies an electrical signal to the printed circuit board and comprising a second connector which is coupled to the first connector and comprises:
a second housing;
a plurality of second terminals which is spaced apart from each other in the first direction of the second housing, and is respectively coupled to the first terminals; and
a second alignment unit disposed on the second housing and is coupled to the first alignment unit.

16. The display apparatus of claim 15, wherein
the plurality of first terminals are arranged in the second direction perpendicular to the first direction, and
the first alignment unit is disposed between two rows of the plurality of first terminals.

17. The display apparatus of claim 16, wherein the socket housing comprises:
a socket bottom part;
first and second sidewalls vertically extending from the socket bottom part and disposed parallel to the first direction; and third and fourth sidewalls vertically extending from the socket bottom part and disposed parallel to the second direction, wherein a plurality of alignment grooves is defined in the first alignment unit and arranged in the first direction.

18. The display apparatus of claim 17, wherein the plurality of alignment grooves comprise a first groove adjacent to the third sidewall and a second groove adjacent to the fourth sidewall, and a first distance between the third sidewall and the first groove is different from a second distance between the fourth sidewall and the second groove.

19. The display apparatus of claim 17, wherein the second alignment unit comprises a plurality of alignment protrusions which respectively corresponds to the plurality of alignment grooves and are respectively coupled to the plurality of alignment grooves.

20. The display apparatus of claim 19, wherein the second housing comprises:

a plug bottom part; and fifth and sixth sidewalls protruding from the plug bottom part and disposed parallel to the first direction, wherein the plurality of alignment protrusions protrudes from the plug bottom part and is disposed between the fifth and sixth sidewalls.

\* \* \* \* \*